(12) United States Patent
Hopkin

(10) Patent No.: US 11,864,402 B2
(45) Date of Patent: Jan. 2, 2024

(54) COMBINED AUXILIARY ELECTRODE AND PARTIALLY SCATTERING BANK FOR THREE-DIMENSIONAL QLED PIXEL

(71) Applicant: SHARP KABUSHIKI KAISHA, Sakai (JP)

(72) Inventor: Hywel Hopkin, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 335 days.

(21) Appl. No.: 17/245,366

(22) Filed: Apr. 30, 2021

(65) Prior Publication Data

US 2022/0352480 A1 Nov. 3, 2022

(51) Int. Cl.
*H10K 50/11* (2023.01)
*H10K 50/115* (2023.01)
*H10K 50/854* (2023.01)
*H10K 59/122* (2023.01)

(52) U.S. Cl.
CPC ......... *H10K 50/115* (2023.02); *H10K 50/854* (2023.02); *H10K 59/122* (2023.02)

(58) Field of Classification Search
CPC .. H10K 50/115; H10K 50/854; H10K 59/122; H10K 50/814; H10K 50/824; H10K 50/856; H10K 59/1201; H10K 59/1315
See application file for complete search history.

(56) References Cited

U.S. PATENT DOCUMENTS

| 9,105,866 | B2* | 8/2015 | Yoon | H10K 50/824 |
| 2008/0001538 | A1* | 1/2008 | Cok | H10K 50/115 |
| | | | | 313/506 |
| 2014/0312323 | A1* | 10/2014 | Park | H10K 59/1315 |
| | | | | 438/23 |
| 2017/0125725 | A1* | 5/2017 | Paek | H10K 71/12 |

(Continued)

FOREIGN PATENT DOCUMENTS

GB 2569885 A 7/2019

OTHER PUBLICATIONS

Wei-Kai Lee et al., "Three-dimensional pixel configurations for optical outcoupling of OLED displays—optical simulation", Journal of the Society for Information Display, 2019.

(Continued)

*Primary Examiner* — S M Sohel Imtiaz
(74) *Attorney, Agent, or Firm* — ScienBiziP, P.C.

(57) ABSTRACT

A top emitting quantum dot light emitting diode (QLED) apparatus for an emissive display apparatus sub-pixel, with at least one bank defining an emissive region of the emissive display apparatus sub-pixel, includes an emissive layer deposited in the emissive region between a first electrode and a second electrode. The first electrode includes a reflective metal, and the second electrode has a transparent conductive electrode and an auxiliary electrode. The bank has a sloped portion adjacent the emissive region. The auxiliary electrode includes a reflective conductive metal and is configured to cover the sloped portion, and the sloped (Continued)

portion is configured at an angle, such that the auxiliary electrode reflects internally reflected light out of the sub-pixel in a viewing direction, and the auxiliary electrode is configured with a partially light scattering surface to broaden a reflective angle range of the auxiliary electrode.

19 Claims, 10 Drawing Sheets

(56) References Cited

U.S. PATENT DOCUMENTS

| | | | |
|---|---|---|---|
| 2017/0141167 A1* | 5/2017 | Naganuma | H10K 50/856 |
| 2018/0097202 A1* | 4/2018 | Forrest | H10K 50/854 |
| 2018/0366672 A1* | 12/2018 | Wang | C09K 11/08 |
| 2019/0097168 A1* | 3/2019 | Pang | H10K 50/824 |
| 2019/0189877 A1* | 6/2019 | Kim | H01L 33/405 |
| 2019/0363279 A1* | 11/2019 | Yamaguchi | H10K 50/16 |
| 2020/0173817 A1* | 6/2020 | Stangelmayer | C12M 31/08 |
| 2020/0251678 A1* | 8/2020 | Song | H10K 59/122 |
| 2023/0085978 A1* | 3/2023 | Kang | G02B 5/206 |
| 2023/0119269 A1* | 4/2023 | Cho | H10K 59/35 |
| | | | 257/13 |

OTHER PUBLICATIONS

Unpublished co-pending U.S. Appl. No. 16/840,261.

* cited by examiner

COMBINED AUXILIARY ELECTRODE AND PARTIALLY SCATTERING BANK FOR THREE-DIMENSIONAL QLED PIXEL

FIELD

The present disclosure is generally related to quantum dot light-emitting diodes (QLEDs), and more particularly related to a QLED display apparatus formed of three-dimensional pixels, where light extraction enhancement is achieved with a transparent electrode and a reflective bank auxiliary electrode.

BACKGROUND

Quantum dot Light Emitting Diodes (QLEDs) are a promising emissive display technology predicted to outperform liquid crystal displays (LCDs) and organic light emitting diode (OLED) displays. OLEDs and QLEDs are both examples of emissive display technologies, where light is generated in response to current passing through a diode. In the diode, electrons and holes are injected into an emissive layer where they combine and emit light.

Control of the light emitted from an OLED/QLED emissive apparatus is enabled by a driving circuit such as a thin film transistor (TFT). The circuitry for driving the apparatus may be printed on a substrate such as plastic or glass. If light is emitted through the substrate, then the apparatus is said to be bottom emitting. If light is emitted in a direction away from the substrate, then the apparatus is said to be top emitting. One issue of bottom emitting OLED/QLED apparatuses is that the emission area is small due to the presence of the driving circuitry. Top emitting OLED/QLED devices can have much larger emission areas as the driving circuitry is positioned beneath the emissive areas of the device.

To create a top emitting OLED/QLED device, a transparent conductive electrode above the emissive region is required. The transparent conductive electrode allows current to spread across the sub-pixels of the display, while enabling high transmission of the emitted light. OLED/QLED displays commonly use a 15-20 nm thin film of Ag/Mg alloy which is semi-transparent and has good conductivity. This semi-transparent electrode has the benefit of creating an interior space, or 'resonance cavity' which narrows the emission band of the device and leads to a high efficiency device having high color saturation.

For a QLED pixel, the emission band for the emissive layer is considerably narrower than that present in an OLED. The advantage of band narrowing in QLEDs is therefore not as effective, as the colors are already saturated. Also, a sub-pixel with an interior space as described above has a strong angular dependence of color shift. Specifically, at wide angles the color may vary considerably.

Additionally, 15-20 nm Ag/Mg alloy is suitable for small (e.g., mobile device, etc.) top emitting OLED displays. However, for larger displays, an issue arises with voltage drop across the display. Such a thin metal transparent conductive electrode is generally not conductive enough to transport current evenly across the whole display. This leads to a voltage drop between the edges and the center of the display. For small displays (such as the aforementioned mobile device), this voltage drop is small and can be compensated for with the driving circuitry. For a larger display, such as a tablet or a television, however, the voltage drop is large and leads to considerable brightness variation across the display.

One solution proposes a nanoparticle transparent conductive electrode in combination with an auxiliary wire grid electrode to solve the problem of insufficient conductivity. The nanoparticle transparent conductive electrode is highly transparent and so removes the unwanted resonance cavity. The auxiliary electrode is positioned in the non-emissive regions of the pixel and therefore may be relatively thick, leading to a very high conductivity which enables current to be effectively and evenly transported across larger displays.

For QLED displays to outperform OLEDs in terms of efficiency, the light extraction from each sub-pixel needs to be optimized. This requires a special design of the QLED sub-pixel structure so that the maximum amount of light can be directed outwards from the display. One manner of accomplishing maximum output proposes a 3-dimensional pixel configuration with reflective banks and filler material to help increase extraction. This design is improved by creating a detuned interior space along with an optimized wave-guiding structure which allows for light emitted at wide angles to reflect off the reflective banks and be redirected to a narrower viewing angle.

The nanoparticle transparent conductive electrode with auxiliary wire grid structure requires the patterning of the auxiliary electrode on top of the nanoparticle layer. The patterning process must be compatible with the other QLED materials (i.e., with no harsh conditions). One of the preferred methods for mass production is to use a wet etch method for patterning the auxiliary electrode. On a banked substrate, the materials deposited on the bank slope are generally thinner and not necessarily as uniform as in the center of the emissive area. During a wet etch process, these thinner areas may be more porous, and therefore less resilient, which means they are more susceptible to attack from the etchant used. Attack in these areas can lead to considerable damage to the QLED layers and very inconsistent quality across a display area.

One solution uses pixel structures with high banks, and the banks have a reflective layer deposited on the slope of the bank. To avoid crosstalk and current leakage, the reflective layer must either be extremely carefully patterned, or an additional insulating layer must be carefully patterned on top of the reflective bank. These extra high precision processing steps are undesirable for mass production. This design also requires the light, which is designed to be reflected off the bank, to pass through the transparent electrode and possibly other QLED materials multiple times which can lead to unwanted absorption.

The present disclosure seeks to improve upon the methods described above.

The basic QLED structure comprises an emissive layer (EML) disposed between a top electrode and a bottom electrode. The emission in the emissive layer comes from quantum dots (QDs) which may be composed of a range of materials such as CdSe, ZnN, InP, and ZnSe. The QDs may have a core-shell structure and may have ligands surrounding each quantum dot.

To aid charge transport from the electrodes into the EML, there is generally a charge transport layer (CTL) between the EML and the top electrode, and another CTL between the EML and the bottom electrode. There are two types of charge transport layers: electron transport layers (ETLs) and hole transport layers (HTLs). When an ETL is deposited between the EML and the top electrode, the QLED is said to have a conventional structure. When an HTL is deposited between the EML and the top electrode, the QLED is said to have an inverted structure. Common ETL materials include ZnO, MgZnO, and AlZnO. Common HTL materials include TFB, PVK, and OTPD.

To further aid charge balancing in the QLED apparatus, the QLED structure may also include hole injections layers (HILs) (such as HIL-8 and PEDOT:PSS), electron injection layers (EILs) (such as LiF and $MoO_3$), hole blocking layers (HBLs), and electron blocking layers (EBLs) (such as PMMA, PEIE, and PEI).

The present disclosure does not relate to a specific QLED apparatus structure and therefore is not limited to any combination of the layers and materials stated above.

SUMMARY

Disclosed is a top emitting quantum dot light emitting diode (QLED) apparatus for an emissive display apparatus sub-pixel. The QLED includes at least one bank defining an emissive region of the emissive display device sub-pixels. The top emitting QLED apparatus has an emissive layer deposited in the emissive region between a first electrode and a second electrode. The first electrode comprises a reflective metal. The second electrode comprises a transparent conductive electrode and an auxiliary electrode. The bank (or banks) comprises a sloped portion adjacent the emissive region.

The auxiliary electrode comprises a reflective conductive metal and is configured to cover the sloped portion. The sloped portion is configured at an angle, such that the auxiliary electrode reflects internally reflected light, including totally internally reflected light, out of the sub-pixel in a viewing direction. Additionally, the auxiliary electrode is configured with a partially light scattering surface to broaden a reflective angle range of the auxiliary electrode.

The top emitting QLED may include a partially light scattering surface that comprises a thin film scattering layer deposited over the auxiliary electrode, the thin film scattering layer being between 0.1 nm and 10 nm in thickness. The top emitting QLED may include a transparent conductive electrode comprising nanoparticles measuring between 20 nm and 100 nm on the sloped portion, thereby imparting an optically rough surface to the auxiliary electrode for scattering light. The top emitting QLED may include a discontinuous monolayer of nanoparticles deposited on the transparent conductive electrode, thereby imparting an optically rough surface to the auxiliary electrode for scattering light.

In one implementation, a first area of the transparent conductive electrode covering the sloped portion is thinner than a second area of the transparent conductive electrode covering the emissive region. A first area of the transparent conductive electrode covering the sloped portion may be more porous than a second area of the transparent conductive electrode covering the emissive region.

The top emitting QLED apparatus may include a transparent filler material configured to fill an interior space above the sub-pixel and surrounded by the sloped portion of the at least one bank. The transparent filler material may have a refractive index of between 1.5 and 2.0. In another implementation, the top emitting QLED includes a transparent low refractive index layer covering the transparent filler material, the transparent low refractive index layer having a refractive index of between 1.0 and 1.5. The bank (or banks) may comprise a top portion adjacent to the sloped portion, and the auxiliary electrode preferably covers the sloped portion and the top portion.

In another implementation, a top emitting QLED apparatus for an emissive display apparatus has a plurality of sub-pixels separated by a bank structure (or structures), with each sub-pixel having an emissive region, which includes a plurality of emissive layers, each disposed in the emissive region between a plurality of first electrodes and a second electrode. The plurality of first electrodes preferably comprises a reflective metal, individually separated by the bank structure (or structures). The second electrode comprises a transparent conductive electrode and an auxiliary electrode. The bank structure comprises a plurality of sloped portions, each surrounding the corresponding emissive region.

The auxiliary electrode comprises a reflective conductive metal configured to cover the plurality of sloped portions. The plurality of sloped portions are each configured at an angle, such that the auxiliary electrode reflects internally reflected light out of each sub-pixel in a viewing direction. The auxiliary electrode also comprises a partially light scattering surface configured to broaden a reflective angle range of the auxiliary electrode.

The partially light scattering surface may comprise a thin film scattering layer deposited over the auxiliary electrode, the thin film scattering layer being between 0.1 nm and 10 nm in thickness. The transparent conductive electrode may comprise nanoparticles measuring between 20 nm and 100 nm on the plurality of sloped portions, thereby imparting an optically rough surface to the auxiliary electrode for scattering light. The transparent conductive electrode may comprise a discontinuous, or interrupted monolayer of nanoparticles deposited on the transparent conductive electrode on the plurality of sloped portions, thereby imparting an optically rough surface to the auxiliary electrode for scattering light.

The top emitting QLED apparatus may include a first area of the transparent conductive electrode covering the plurality of sloped portions, which is thinner than a second area of the transparent conductive electrode covering the corresponding emissive region. The first area of the transparent conductive electrode covering the sloped portions may be more porous than a second area of the transparent conductive electrode covering the corresponding emissive region. The top emitting QLED may include a transparent filler material configured to fill an interior space above the sub-pixel and surrounded by at least one of the plurality of sloped portions. The transparent filler material may have a refractive index of between 1.5 and 2.0.

The top emitting QLED may comprise a transparent low refractive index layer over the transparent filler material, the transparent low refractive index layer having a refractive index between 1.0 and 1.5. The bank structure (or structures) comprises at least one top portion adjacent the plurality of sloped portions, and the auxiliary electrode covers the plurality of sloped portions and the at least one top portion.

BRIEF DESCRIPTION OF THE DRAWINGS

Aspects of the exemplary disclosure are best understood from the following detailed description when read with the accompanying figures. Various features are not drawn to scale, and dimensions of various features may be arbitrarily increased or reduced for clarity of discussion.

FIG. 1A illustrates the layers in a related art structure QLED diode.

FIG. 1B illustrates the layers in a related art inverted structure QLED diode.

DETAILED DESCRIPTION

Figure 2:
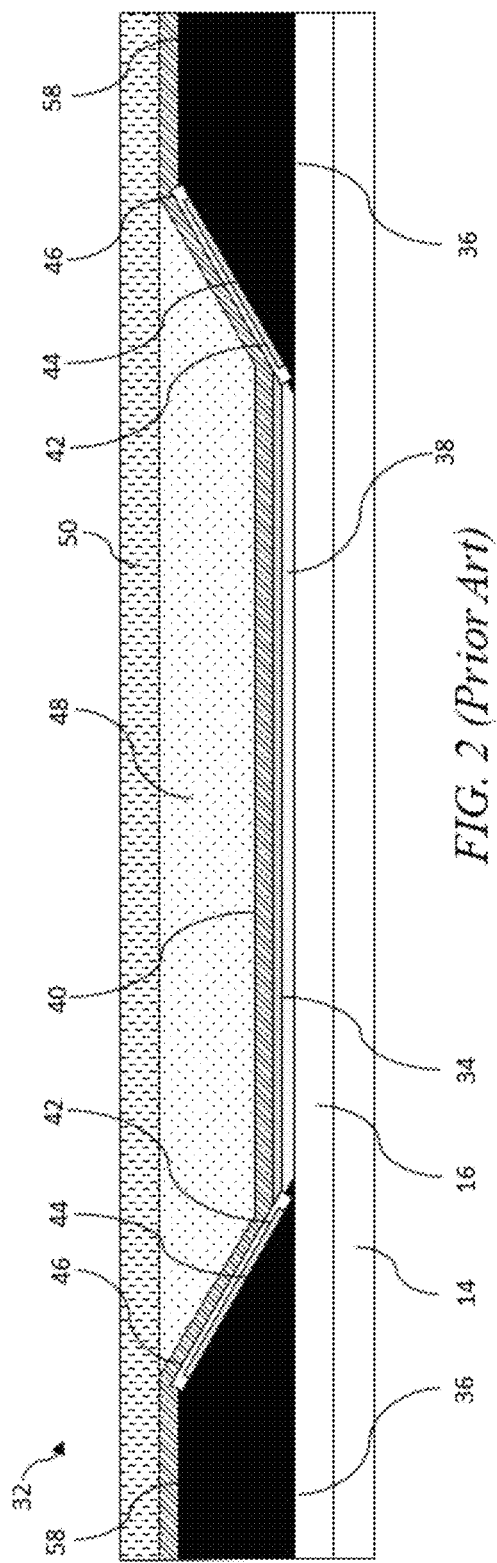
FIG. 2 illustrates an elevation view of a related art three dimensional QLED having a patterned reflective layer.

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale and are not intended to correspond to actual relative dimensions.

For consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series and the equivalent.

Additionally, for purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

Disclosed herein is a top emitting (TE) quantum dot light emitting diode (referred to in the art as QLED, QDLED, or QDEL; hereinafter "QLED"). QLEDs may be part of an array of independently controllable red, green, and blue (RGB) QLED sub-pixels, which together, typically form the individual pixels of a full color display.

Figures 1A, 1B:
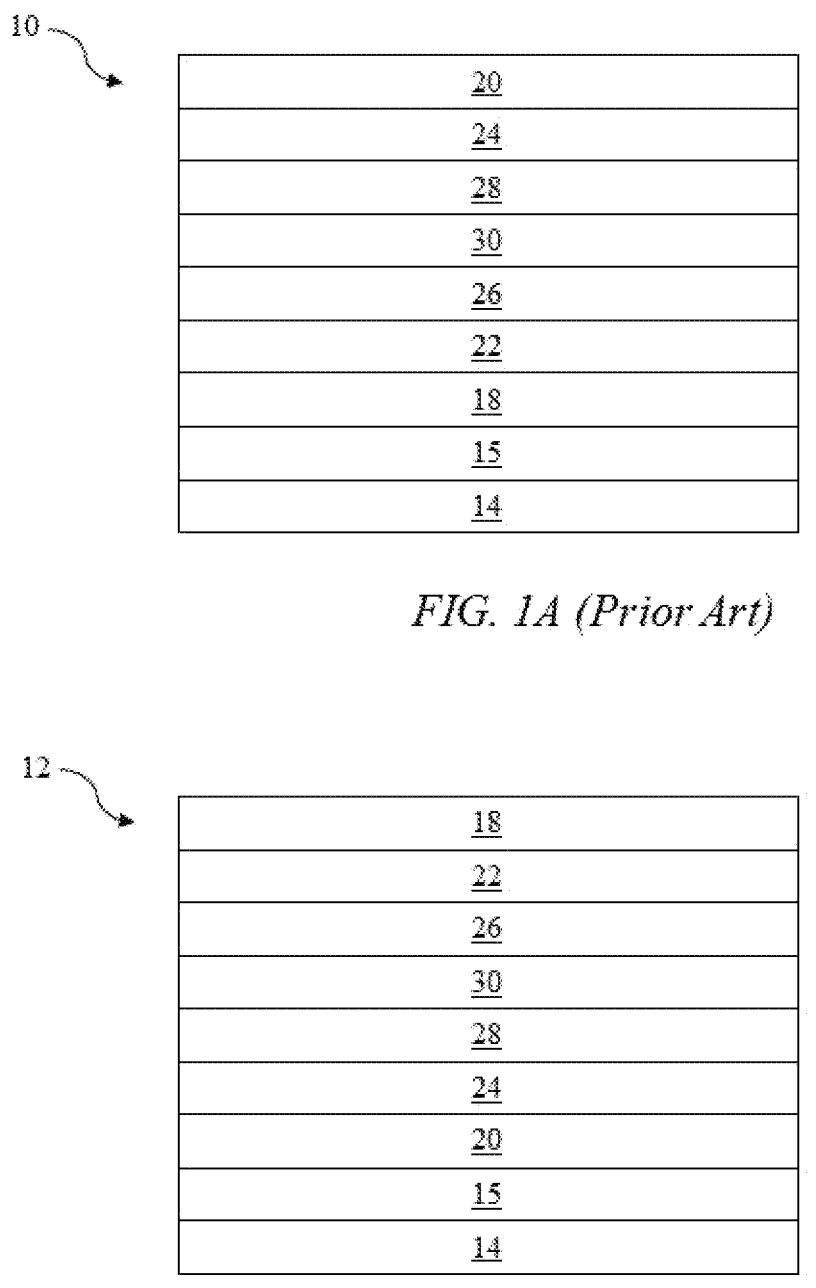

Referring to FIGS. 1A and 1B, top emitting QLEDs may exhibit either a standard layer structure or an inverted layer structure. FIG. 1A shows a related art standard (e.g., non-inverted) top emitting QLED 10, while FIG. 1B illustrates a related art inverted top emitting QLED 12. The standard QLED 10 and inverted QLED 12 typically include a substrate layer 14 on which is formed a reflector layer 15. The standard QLED 10 and inverted QLED 12 also include an anode layer 18, cathode layer 20, hole injection layer (HIL) 22, hole transport layer (HTL) 26, electron injection layer (EIL) 24, and electron transport layer (ETL) 28, in addition to an emissive layer (EML) 30. In the standard QLED 10 and inverted QLED 12, the substrate layer 14 and the reflector layer 15 form the bottom layers.

Figure 3:
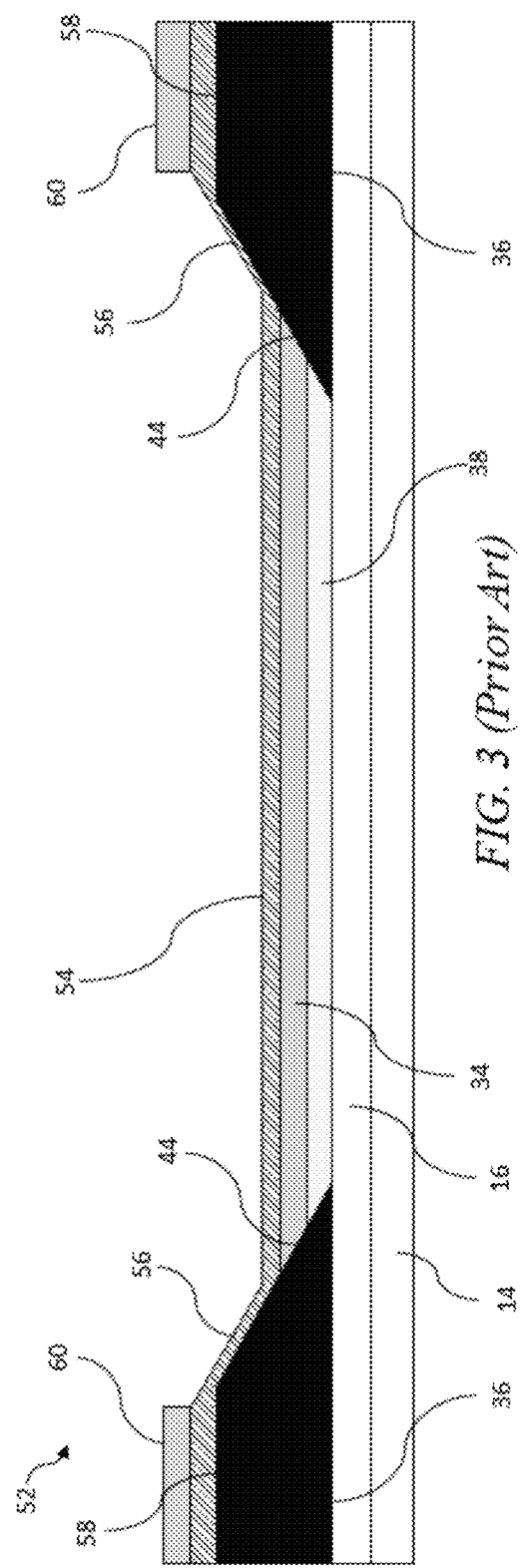
FIG. 3 illustrates an elevation view of a related art three dimensional QLED having a patterned auxiliary electrode.

Referring to FIG. 1A, in the standard structure QLED 10, an anode layer 18 layer is placed over the reflector layer 15 to serve as a bottom electrode. The reflector layer 15 and the anode layer 18 may be the same material forming a single reflective bottom electrode 38 as illustrated in FIGS. 2-3. 5-7, and 9-12. An HIL 22 is formed over the anode layer 18. An HTL 26 is formed over the HIL 22. The EML 30 is formed over the HTL 26. An ETL 28 is formed over the EML 30. An EIL 24 is formed over the ETL 28. The cathode layer 20 is formed over the EIL 24 to serve as a top electrode and complete the standard structure QLED 10 diode.

Referring to FIG. 1B, in the inverted QLED 12, a cathode layer 20 is placed over the reflector layer 15 to serve as the bottom electrode. The reflector layer 15 and the cathode layer 20 may also be the same material forming a single reflective bottom electrode 38 as illustrated in FIGS. 2-3, 5-7, and 9-12. An EIL 24 is placed over the cathode layer 20. An ETL 28 is placed over the EIL 24. The EML 30 is formed over the ETL 28. An HTL 26 is placed over the EML 30. An HIL 22 is placed over the HTL 26. The anode layer 18 is formed over the HIL 22 to serve as a top electrode and complete the inverted QLED 12.

FIG. 2 illustrates an elevation view of a first related art three-dimensional top emitting QLED sub-pixel structure (hereinafter, "first related art QLED sub-pixel") 32, which may have either a standard (non-inverted) or an inverted QLED diode structure as discussed above. The first related art QLED sub-pixel 32 includes a substrate layer 14 atop which a thin film transistor (TFT) circuitry 16 is formed. Each first related art QLED sub-pixel 32 includes an emissive region 34, including an EML 30 (FIGS. 1A/1B) for providing luminance. The emissive region 34 is defined by one or more bank structures 36. The first related art QLED sub-pixel 32 is controlled by a reflective bottom electrode 38. Reflective bottom electrodes 38 of adjacent first related art QLED sub-pixels 32 are separated by bank structures 36

(or a surrounding bank structure 36). Each reflective bottom electrode 38 is separated between each first related art QLED sub-pixel 32 to prevent shorting between individual reflective bottom electrodes 38 since the reflective materials comprising the reflective bottom electrode 38 are generally conductive. The bottom electrodes 38 are driven by a driving circuit (not shown) to control the first related art QLED sub-pixels 32 individually. In contrast to having separate reflective bottom electrodes 38, all first related art QLED sub-pixels 32 in a pixel array (not shown) share a common top transparent conductive electrode (TCE) 40, which is formed over the emissive region 34 and bank structures 36.

The bank structures 36 include sloped surfaces 44 extending downward from a top portion 58 of the bank structure 36 toward the emissive region 34. A patterned reflective layer 42 is formed over each sloped surface 44. A patterned insulating layer 46 is formed over each patterned reflective layer 42. The patterned insulating layer 46 separates the patterned reflective layer 42 from the TCE 40, extending over the bank structure(s) 36, including the sloped surface 44. The primary role of the insulating layer 46 is that it prevents shorting between the TCE 40 and the bottom electrode 38. If the patterned reflective layer 42 lacks an insulator such as the insulating layer 46, there is a potential for the reflective layer 42 to contact the bottom electrode 38 due to manufacturing errors. This could result in the TCE 40 and the bottom electrode 38 coming into electrical contact. A filler material 48 is formed over the TCE 40, filling the space over the emissive region 34 and sloped surfaces 44 of the bank structures 36. A continuous low refractive index layer 50 is formed over the filler material 48 and the bank structures 36. In a first related art QLED sub-pixel array, all first related art QLED sub-pixels 32, including emissive regions 34 and bank structure(s) 36, are covered by the low refractive index layer 50.

FIG. 3 illustrates in elevation view a second related art three-dimensional top emitting QLED sub-pixel structure (hereinafter, "second related art QLED sub-pixel") 52, which may have either a standard (non-inverted) or an inverted QLED diode structure as discussed above. Similar to the first related art QLED sub-pixel 32, the second related art QLED sub-pixel 52 includes a substrate layer 14 and TFT circuitry 16. Each second related art QLED sub-pixel 52 includes an emissive region 34, including an EML 30 (FIGS. 1A/1B) for providing luminance. The emissive region 34 is defined by one or more bank structures 36. The second related art QLED sub-pixel 52 is also controlled by an independent bottom electrode 38. Reflective bottom electrodes 38 of adjacent second related art QLED sub-pixels are separated by bank structures 36 (or a surrounding bank structure 36). The reflective bottom electrodes 38 are driven by a driving circuit (not shown) to control second related art QLED sub-pixels 52 individually. In contrast to having separate bottom electrodes, all second related art QLED sub-pixels 52 in a pixel array (not shown) share a common top nanoparticle TCE layer 54, which is formed over the emissive region 34 and bank structures 36.

Using a nanoparticle TCE layer 54 in the second related art QLED sub-pixel 52 results in a thinner portion 56 of the nanoparticle TCE layer 54 being deposited on the sloped surfaces 44 of the bank structures 36. These thinner portions 56 are generally not as uniform as the portions of nanoparticle TCE layer 54 formed over the emissive region 34 and on the top portions 58 of the bank structures 36. A patterned auxiliary electrode 60 is formed over the top portions 58 of the bank structures 36. Generally, nanoparticle TCE layers 54 in such an arrangement are not sufficiently conductive to transport current across an entire display but are sufficiently conductive to transport current from the auxiliary electrode 60 to the sub-pixel 52.

Figure 4:
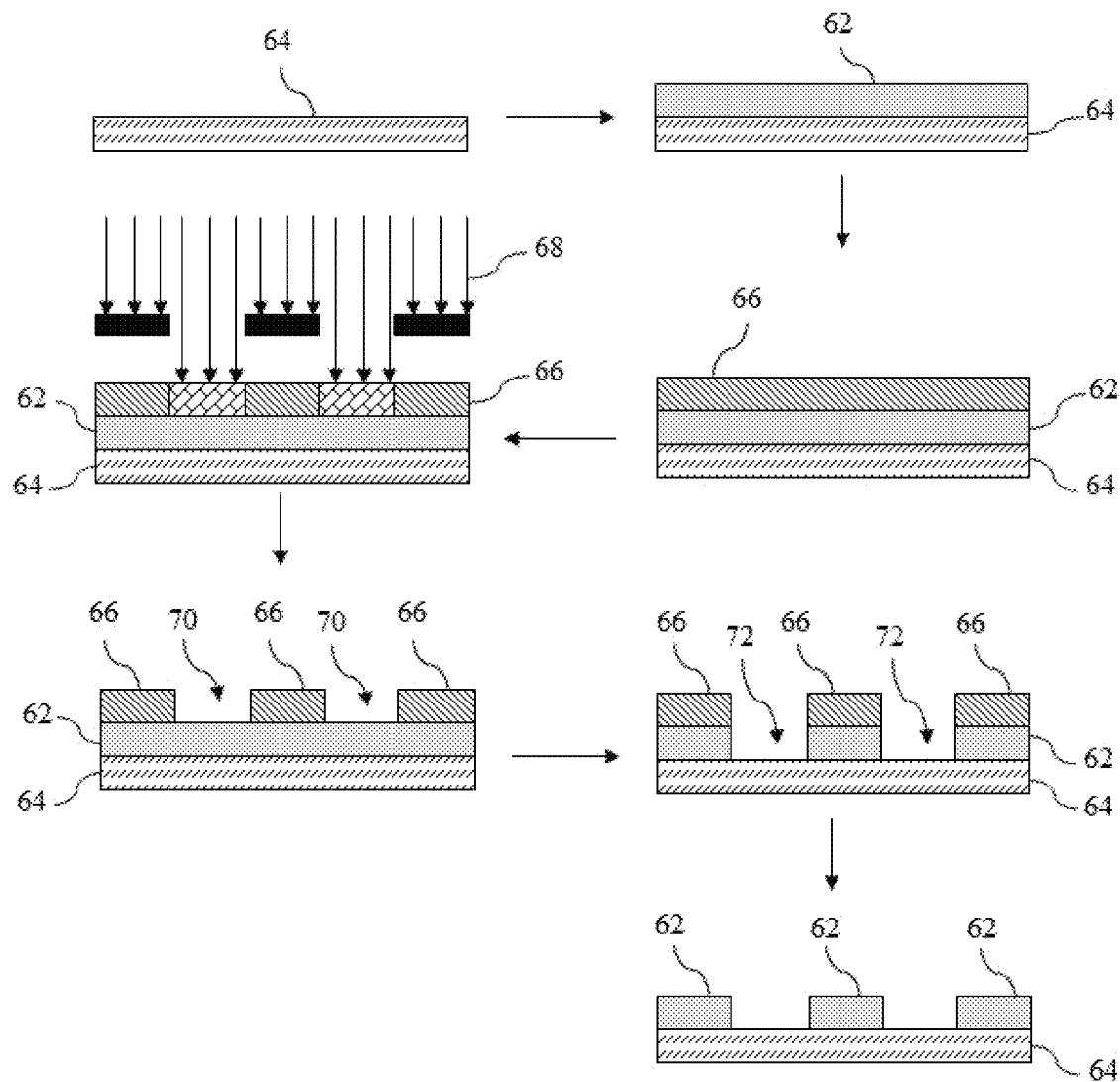
FIG. 4 illustrates a process flow for patterning an electrode using UV lithography and wet etching.

FIG. 4 illustrates how a wet etch process may work for patterning metal, in the process of creating three dimensional QLED sub-pixels. For example, the first related art QLED sub-pixel 32 and the second related art QLED sub-pixel 52 might be manufactured in part using such a method. In FIG. 4, a continuous metal layer 62 is deposited on a substrate 64 (for example, by vapor deposition, thermal evaporation, or another method). A photoresist 66 is then deposited on top of the metal layer 62. The photoresist 66 is then selectively exposed to UV light 68. Exposure to the UV light 68 alters the solubility of the photoresist 66 in different solvents.

Figure 5:
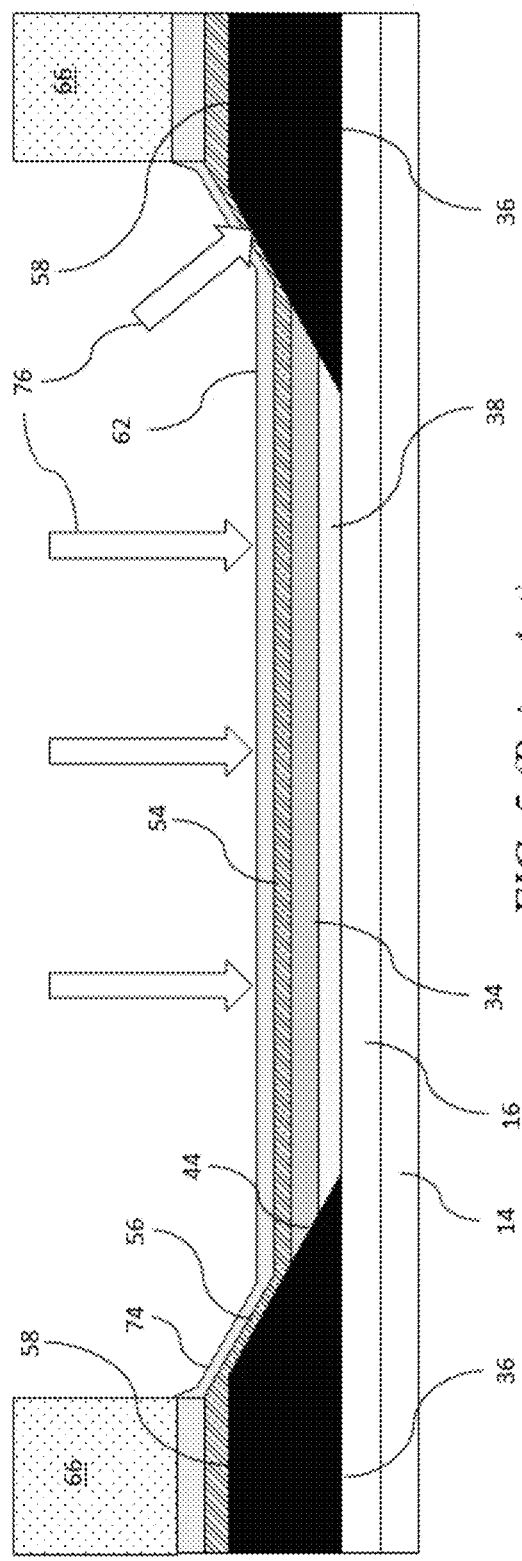
FIG. 5 illustrates a related art action in patterning via UV lithography and wet etching a QLED.
Figure 6:
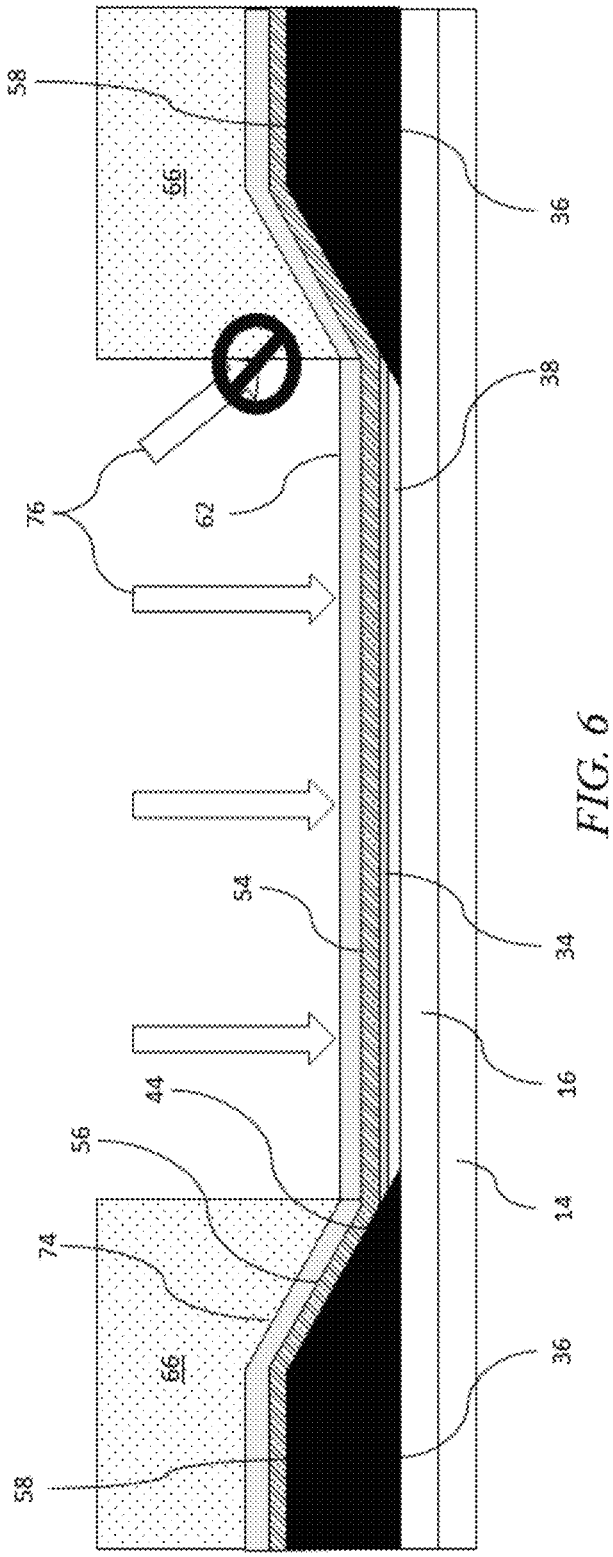
FIG. 6 illustrates an action in patterning via UV lithography and wet etching an improved QLED, in accordance with an example implementation of the present disclosure.

The photoresist 66 is then patterned by washing away the soluble regions 70 of the photoresist 66 in a developer solution (not shown). The exposed regions 72 of the metal layer 62 beneath the photoresist soluble regions 70 are then etched away using a chemical etchant 76 (FIGS. 5 and 6). The remaining photoresist 66 can then be washed away using a remover solution (not shown). This wet etch process allows patterned metal layers 62 to be created on surfaces, and the process is a good candidate for patterning an auxiliary electrode 60 such as the one shown in FIG. 3. However, the various layers of a top emitting QLED, such as the second related art QLED sub-pixel 52 (both standard and inverted) may be damaged by a such a wet etch process.

FIG. 5 illustrates how the metal layer 62 (e.g., as shown in FIG. 4) removal step in a wet etch process may work when manufacturing the second related art QLED sub-pixel 52 shown in FIG. 3, after soluble regions of photoresist 66 (e.g., those areas over the emissive region 34 and sloped surfaces 44 of the bank structures 36) have been removed. The metal etchant 76 is shown in this view as it would attack and etch away the exposed regions of the metal layer 62 of the second related art QLED sub-pixel 52 (e.g., as shown in FIG. 3).

The auxiliary electrode 60 structure of the second related art QLED sub-pixel 52 (FIG. 3) is preferable to the TCE 40 of the first related art QLED sub-pixel 32 (FIG. 2). As discussed, deposition of the nanoparticle TCE layer 54 results in the thinner portion 56 of the TCE layer 54 forming on the sloped surface 44 of the bank structures 36. Additionally, during a wet etch process, deposition of the metal layer 62 over the nanoparticle TCE layer 54 results in a reduced thickness portion 74 of the metal layer 62 on the sloped surface 44 of the bank structures 36.

Having the reduced thickness portion 74 of the metal layer 62 on the sloped surfaces 44 of the bank structures 36 may lead to a chemical attack on the thinner portions 56 (i.e., weaker regions) of the nanoparticle TCE layer 54. Specifically, the metal etchant 76 can damage the thinner portion 56 of the nanoparticle TCE layer 54 on the sloped surfaces 44 of the bank structures 36. Because the metal in the reduced thickness portion 74 is thinner, it is etched away in a shorter time, compared to the metal of the emissive region 34. Therefore, the thinner (i.e., weaker) portion 56 region of the nanoparticle TCE layer 54 is exposed to chemical attack for a period of time, while the thicker metal regions are still being etched. As discussed, damage in these areas can lead to damage to the QLED layers and inconsistent quality across a display area.

Figure 7:
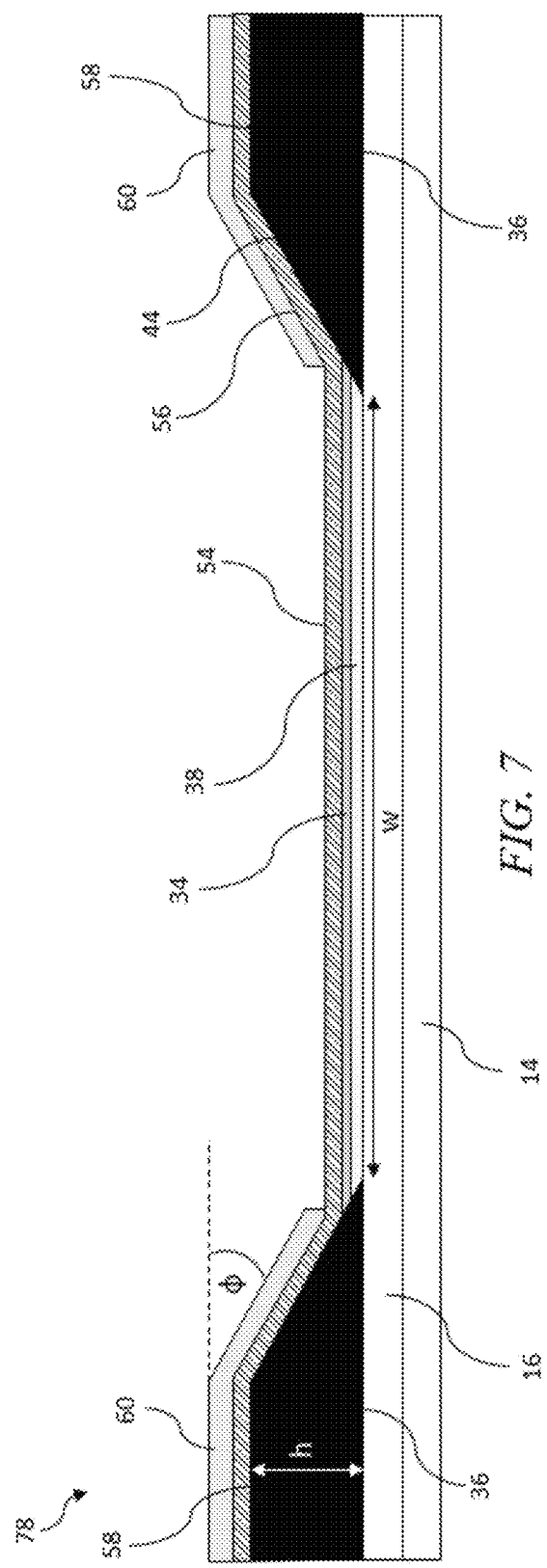
FIG. 7 illustrates an improved QLED sub-pixel formed via UV lithography and wet etching, in accordance with an example implementation of the present disclosure.

Referring to FIG. 6, an action in a wet etch process is shown for manufacturing a combined auxiliary electrode and partially scattering bank for a three-dimensional QLED sub-pixel 78 (e.g., as shown in FIG. 7), in accordance with an example implementation of the present disclosure. In FIG. 6, the design of photoresist 66 patterning protects the aforementioned weaker regions of the nanoparticle TCE layer 54 and metal layer 62 on the sloped surfaces 44 of the bank structures 36. The photoresist 66 is patterned such that only the portion of the metal layer 62 covering the emissive region 34 is exposed for etching away by the metal etchant 76. The portion of the metal layer 62 covering the bank structures 36, including the sloped surfaces 44 and top portions 58, is protected by the photoresist 66 and thereby left intact after the wet etch process. This design prevents the metal etchant 76 from attacking the thinner nanoparticle TCE layer 54.

FIG. 7 shows a completed combined auxiliary electrode and partially scattering bank for a three-dimensional QLED sub-pixel 78, in accordance with an example implementation of the present disclosure. Driving thin film transistor (TFT) circuitry 16 is printed on the substrate layer 14. The QLED sub-pixel 78 includes a combined reflective bottom electrode 38 (serving as a reflective layer and a bottom electrode) deposited on, and in electrical contact with, the TFT circuitry 16. The emissive region 34 has a width ("w"), as defined by the bank structures 36. The bank structures 36 have height ("h") and the bank structures 36 isolate the bottom electrode 38 from other bottom electrodes in adjacent QLED sub-pixels. The nanoparticle TCE layer 54 is deposited continuously across the entire QLED sub-pixel 78, including the emissive region 34 and entire bank structures 36 (sloped surfaces 44 and top portions 58), and over adjacent QLED sub-pixels so that for any particular QLED sub-pixel array, all QLED sub-pixels are covered by the nanoparticle TCE layer 54.

For each QLED sub-pixel 78, the various QLED layers (e.g., as shown in FIGS. 1A and 1B for standard and inverted structures), including HILs 22, EILs 24, HTLs 26, ETLs 28, and their related EMLs 30, are deposited between the reflective bottom electrode 38 and the nanoparticle TCE layer 54. Different EMLs 30 are patterned in adjacent QLED sub-pixels 78, to produce adjacent red, green, and blue (RGB) sub-pixels (thereby enabling a full color pixel display). Other layers such as the HIL 22, EIL, 24, HTL 26, and ETL 28 may be common to all sub-pixels or may be patterned. The metal layer 62 (as shown in FIG. 6) has been selectively etched, thereby forming a patterned auxiliary electrode 60 covering non-emissive regions of the QLED sub-pixel 78 (e.g., covering the bank structures 36, including the top portions 58 and the sloped surfaces 44). The patterned auxiliary electrode 60 extends down the sloped surfaces 44 towards the emissive region 34, at an angle θ relative to the horizontal plane of the QLED sub-pixel 78. In various implementations, the angle θ may be modified by controlling the angle of the bank structure 35 slope surfaces.

Figure 8:
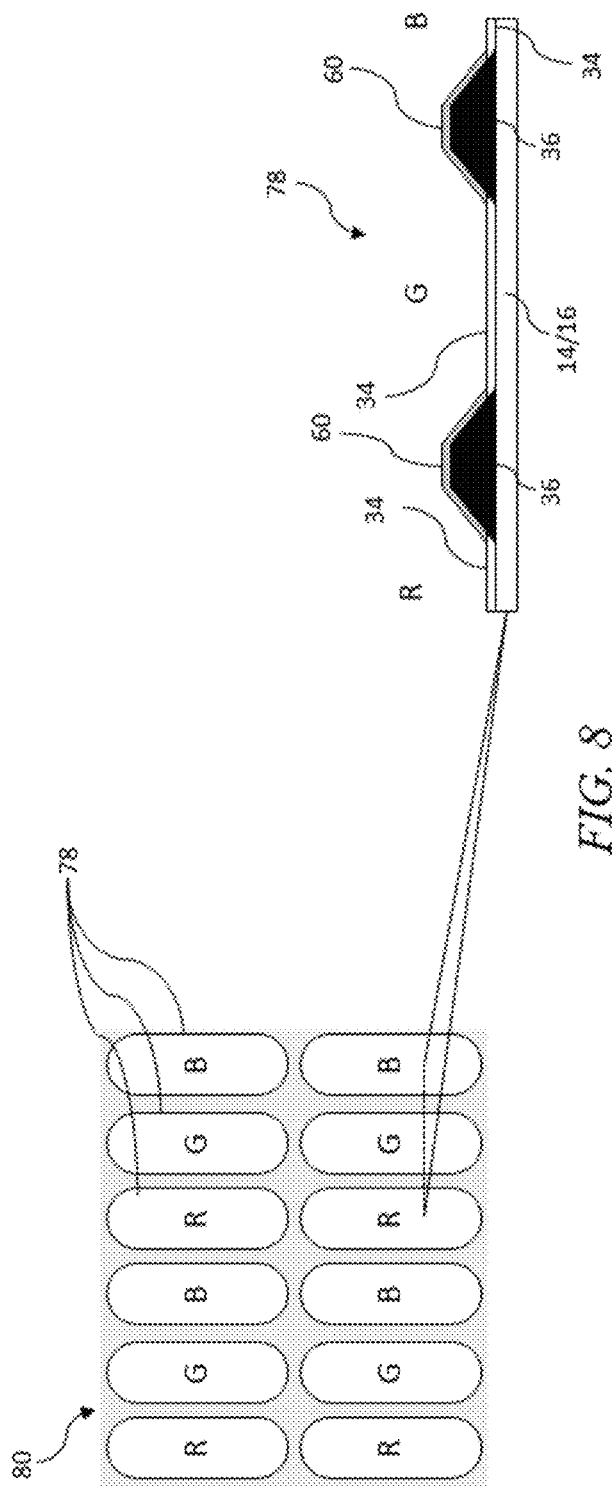
FIG. 8 illustrates an array of improved QLED sub-pixels, in accordance with an example implementation of the present disclosure.

Referring to FIG. 8 a QLED sub-pixel array 80 is shown, including a series of adjacent red (R), green (G) and blue (B) QLED sub-pixels 78 arranged in an RGB stripe pattern customary for a color display. Although an RGB stripe pattern is shown in the illustrated implementation, the present disclosure is not limited to such a structure. A section of the QLED sub-pixel array 80, including a QLED sub-pixel 78 is also shown in elevation view as a call out. The emissive regions 34 are defined by the bank structures 36 which isolate the red (R), green (G) and blue (B) QLED sub-pixels 78 from one another. Luminance is emitted from the emissive region 34 of each QLE sub-pixel 78.

Figure 9:
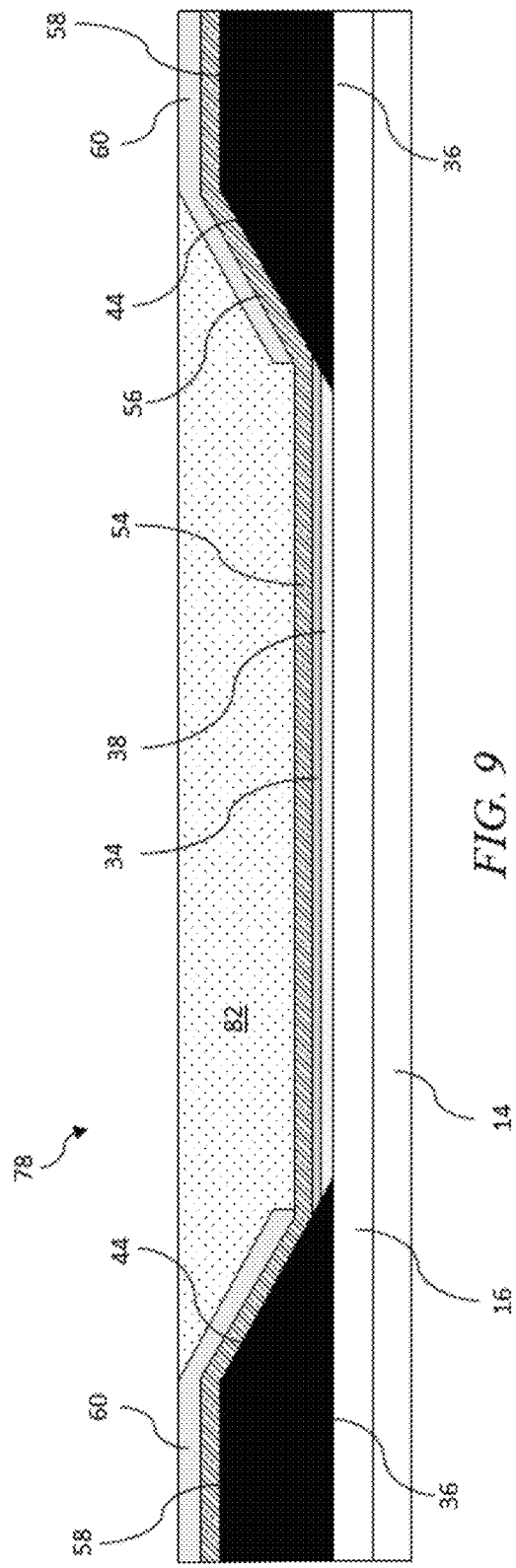
FIG. 9 illustrates an improved QLED sub-pixel including a filler material, in accordance with an example implementation of the present disclosure.

FIG. 9 illustrates an improved QLED sub-pixel including a filler material, in accordance with an example implementation of the present disclosure. In FIG. 9, the QLED sub-pixel 78 includes essentially the features disclosed in FIG. 7, and in addition includes a filler material 82 which is patterned to fill a volume of the QLED sub-pixel 78, as defined by the emissive region 34 and the sloped surfaces 44 of the bank structures 36. The filler material 82 is highly transparent and has a high refractive index.

Figure 10:
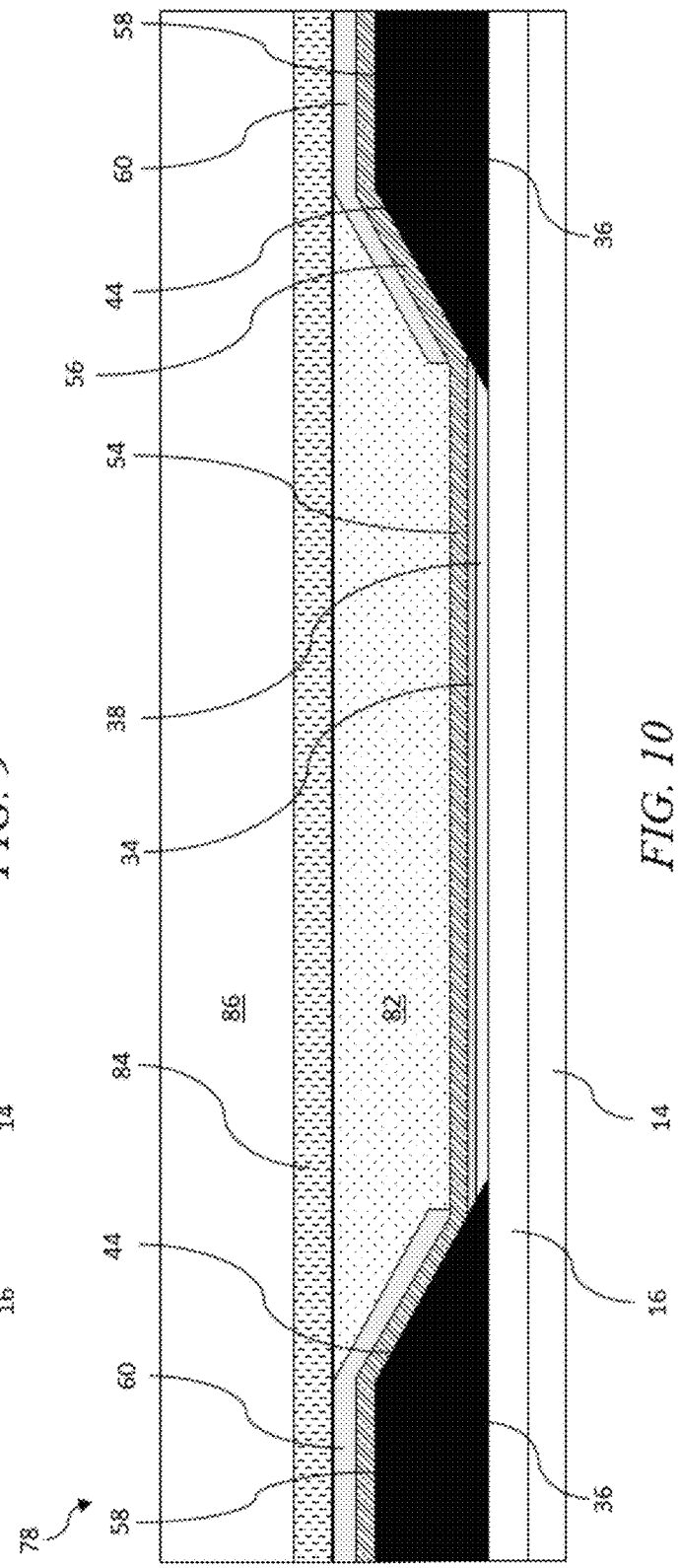
FIG. 10 illustrates an improved QLED sub-pixel including a low refractive index layer and cover glass, in accordance with an example implementation of the present disclosure.

FIG. 10 illustrates an improved QLED sub-pixel including a low refractive index layer and cover glass, in accordance with an example implementation of the present disclosure. In FIG. 10, the QLED sub-pixel 78 includes a low refractive index layer 84 added and is formed above the entire QLED sub-pixel 78 structure (i.e., above the emissive region 34 and filler material 82, and above the bank structures 36 and patterned auxiliary electrode 60). Thus, the low refractive index layer 84 extends across an entire array of QLED sub-pixels 78. A cover glass 86, or similar cover layer material, is formed over the low refractive index layer 84, thereby also extending across an entire array of QLED sub-pixels 78.

Figure 11:
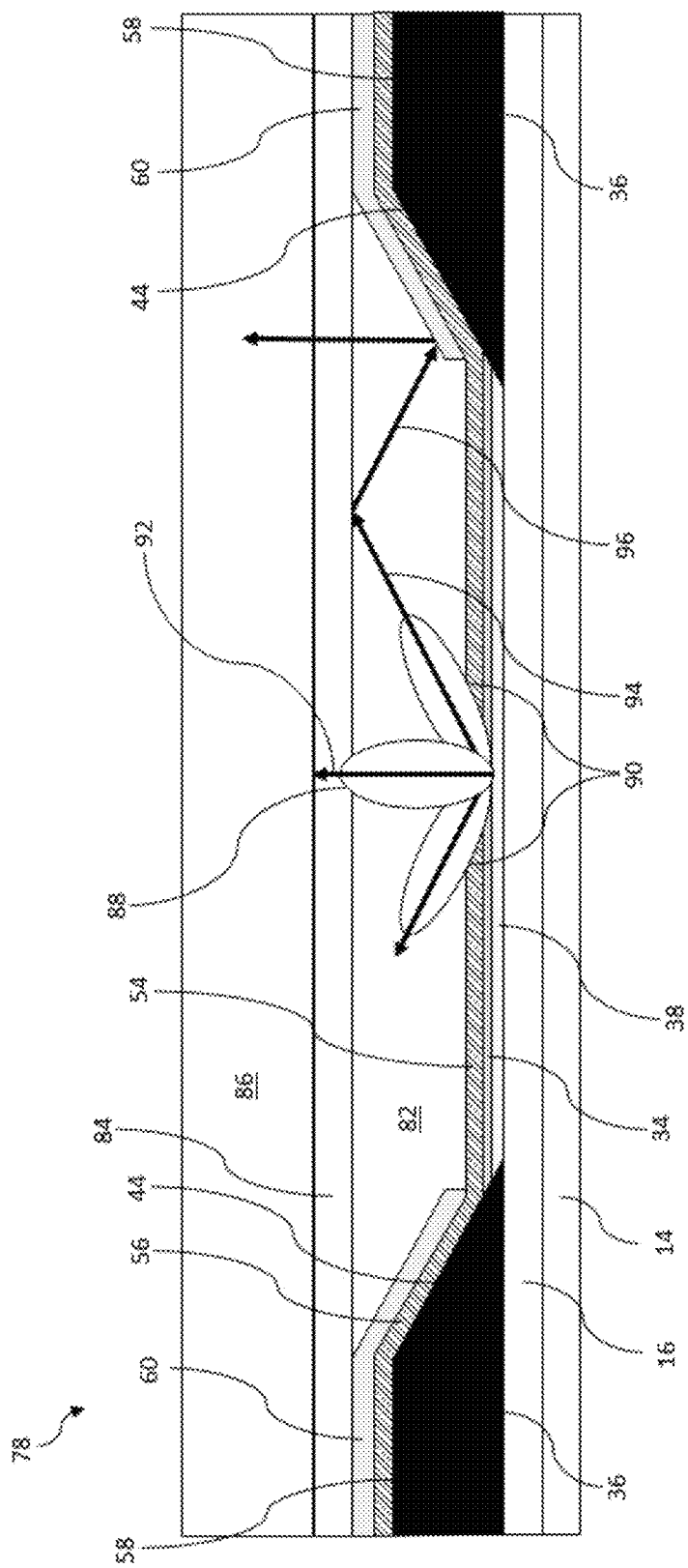
FIG. 11 illustrates a luminance pattern of the improved QLED sub-pixel, in accordance with an example implementation of the present disclosure.

FIG. 11 illustrates a luminance pattern of the improved QLE sub-pixel, in accordance with an example implementation of the present disclosure. In FIG. 11, the luminance emission profile from the emissive region 34 into the filler material 82 occurs along a first direction 88 (or 'lobe'), and a second direction 90 (or 'lobe'). The first direction 88 has strong first intensity 92 on axis. The second direction 90 has strong second intensity 94 at a predetermined wider angle. The QLED sub-pixel 78, with the filler material 82, low refractive index layer 84, is designed so that the angle of emission in the second direction 90 (and therefore the angle of the second intensity 94) is within an angle range required for total internal reflection (TIR) at the boundary of the filler material 82 and the low refractive index layer 84. This causes light emitted along the second direction 90 to be internally reflected in the QLED sub-pixel 78. As such, the luminance of the QLED sub-pixel 78 may be of optimum functionality.

In FIG. 11, one TIR is shown at the boundary of the filler material 82 and the low refractive index layer 84. In other implementations, there may be several TIR reflections between the filler material 82/low refractive index layer 84 boundary and the reflective bottom electrode 38, depending on the angles in various implementations. Preferably in all implementations, including those shown in the illustrations, TIR light 96 emitted along the second direction 90 (i.e., second intensity 94) eventually strikes and reflects off the portion of the patterned auxiliary electrode 60 extending over the sloped surface 44 of the bank structure 36. Due to the predetermined angle θ (FIG. 7) of the sloped surface 44 relative to the horizontal plane of the QLED sub-pixel 78, the TIR light 96 is then directed out of the QLED sub-pixel 78 at a much narrower angle.

In a standard OLED/QLED structure, secondary lobes can usually occur depending on the stack design, but these modes of emission are usually lost within the device and not emitted. An emission mode as shown in FIG. 11 would not usually be desirable in a standard structure as a user would detect a strong luminance variation (with the naked eye) when moving with respect to a display. The design disclosed herein takes these lobes, which would usually be undesirable or lost within the device and redirects them to a narrow angle. This increases the amount of light emitted and on-axis brightness (also known as the collimation ratio).

In various implementations, with reference to the aforementioned figures, the top emitting QLED sub-pixels 78 may be part of an array of independently controllable pixels which form a display. Each QLED sub-pixel 78 has an emissive region 34 which is defined by a bank structure 36. Each QLED sub-pixel 78 is controlled by an independent bottom electrode 38 which is driven by a driving circuit. All QLED sub-pixels have a common top electrode (e.g., TCE 40 or nanoparticle TCE layer 54).

The reflective bottom electrode 38 comprises a reflective metal such as aluminum or silver. The reflective bottom electrode 38 may further comprise a transparent conductive layer such as indium tin oxide (ITO) or indium zinc oxide (IZO).

The top electrode comprises a nanoparticle TCE layer 54 that is continuous across all of the QLED sub-pixels 78 and a patterned auxiliary electrode 60 forms a wire grid around the emissive areas of the QLED sub-pixels 78. The nanoparticle TCE layer 54, in conjunction with the patterned auxiliary electrode 60, has a conductivity that is high enough to transport current evenly from the grid of the auxiliary wire electrode 60 across the emissive region 34 of each QLED sub-pixel 78. The nanoparticle TCE layer 54 is highly transparent to minimize the "resonance cavity" effect.

The nanoparticle TCE layer 54 may be selected from a variety of materials. It may be a transparent conductive nanoparticle layer such as ITO nanoparticles. The nanoparticles may be uniform in size or nanoparticle layer may be a blend of nanoparticles ranging in diameter from 3 nm to 100 nm. Other TCEs may be formed from an ultrathin metal such as 5 nm silver or aluminum, a conductive polymer such as PEDOT:PSS, or a conductive mesh, such as carbon nanotubes or silver nanowires. In the case of a conductive mesh such as carbon nanotubes or metal nanowires, the conductive mesh may be in a transparent matrix material which aids with adhesion. In the case of a thin metal, it may be formed of a material such as aluminum, silver, or platinum. The thin metal may be thinner than state of the art thin metal electrodes to achieve higher transmission. For example, the thin metal may have a thickness of between 5 nm and 20 nm.

The bank structures 36 between QLED sub-pixels 78 provide regions where different colored EMLs 30 of different QLED sub-pixels 78 can be deposited but also provide insulation between the different sub-pixel areas so that crosstalk between QLED sub-pixels 78 is minimized. The bank structures 36 have a large height relative to the thickness of the conductive, emissive, and other layers (HIL 22, EIL 24, HTL 26, ETL 28, and EMLs 30, including the bottom electrode 38 and nanoparticle TCE layer 54) of the QLED sub-pixel 78. The bank structures 36 have a gradual slope at the edges of the QLED sub-pixels 78, making an angle θ to the horizontal plane of a QLED display. The bank structures 36 also provide insulation from the nanoparticle TCE layer 54, ensuring that current flows across and into the emissive region 34 of the QLED sub-pixel 78 rather than directly down from the patterned auxiliary electrode 60.

Since patterning of the patterned auxiliary electrode 60 on top of a QLED apparatus should not damage the layers of the QLED, the temperature should be low so as not to damage the quantum dots (QDs) or the substrate (if plastic). QLED fabrication is aiming to be much cheaper than OLED fabrication and so ideally the process is solution process compatible. One feasible method is the aforementioned chemical wet etch to pattern the auxiliary electrode.

As discussed above and shown in the aforementioned figures (in particular in FIG. 4), a continuous metal layer 62 is deposited on a substrate (by vapor deposition, thermal evaporation or other method). Photoresist is then deposited on top of the metal layer 62. The photoresist is selectively exposed to UV light 68. Exposure to UV light 68 alters the solubility of the photoresist in different solvents. The photoresist is then patterned by washing away the soluble regions of the photoresist in a developer solution. The exposed regions of the metal layer 62 are then etched away using a chemical etchant. The remaining photoresist can then be washed away using a remover solution. This process allows for a metal layer to be patterned and is a good candidate for patterning a patterned auxiliary electrode 60.

Chemical etchants can damage or wash away the layers in a QLED device. It is therefore important that the TCE is resilient to the wet etch process. In the case of a QLED sub-pixel 78 with bank structures 36 in between emissive regions 34, the nanoparticle TCE layer 54 is uniform and resilient. However, on sloped surfaces 44 of the bank structures 36, the nanoparticle TCE layer 54 can become thinner and less uniform. This can lead to the nanoparticle TCE layer 54 being more porous and less resilient to the chemical etchant. Increased porosity means the etchant can permeate through in the sloped surfaces 44 of the bank structures 36 and attack the QLED layers. Even though the etching process is time dependent, close control over timing cannot be relied upon as the thickness of the metal layer 62 may also be thinner at the sloped surfaces 44 of the bank structures 36, meaning it is etched away more quickly.

In a first implementation, the patterned auxiliary electrode 60 is redesigned so that the thinner more porous regions on the sloped surfaces 44 of the bank structures 36 are protected during the wet etch process. The patterned auxiliary electrode 60 caps the bank structure 36 and extends down the sloped surface 44 to the edge of the emissive region 34. The patterning of the photoresist during the wet etch process prevents the etchant from attacking these regions, as illustrated in FIGS. 6 and 7.

This patterned auxiliary electrode 60 that extends over the bank structure 36, follows the shape of the bank structure 36. If the patterned auxiliary electrode 60 is formed from a highly reflective metal such as aluminum or silver, then the patterned auxiliary electrode 60 provides a reflective surface at a similar angle to the sloped surface 44 of the bank structure 36.

The first implementation therefore further provides a reflective bank structure 36 that can be used in the 3-D pixel design. This replaces the need to precisely pattern an isolated reflective layer on the banks before the QLED layers are deposited. This reflective bank structure 36 does not need isolation as it is all doubling up as the auxiliary electrode 60 which is in electrical contact with the nanoparticle TCE layer 54.

To obtain high light extraction from the 3-dimensional QLED sub-pixel 78, as discussed above, the angle of the sloped surface 44 and the emission profile from the QLED structure into the filler material 82 should be carefully designed. The tolerance for achieving maximum light extraction can be very high, and so in mass production there may be a lot of variation in efficiency between pixels. If the tolerance of the design can be lowered, then the uniformity of the efficiency across a display can be improved.

Figure 12:
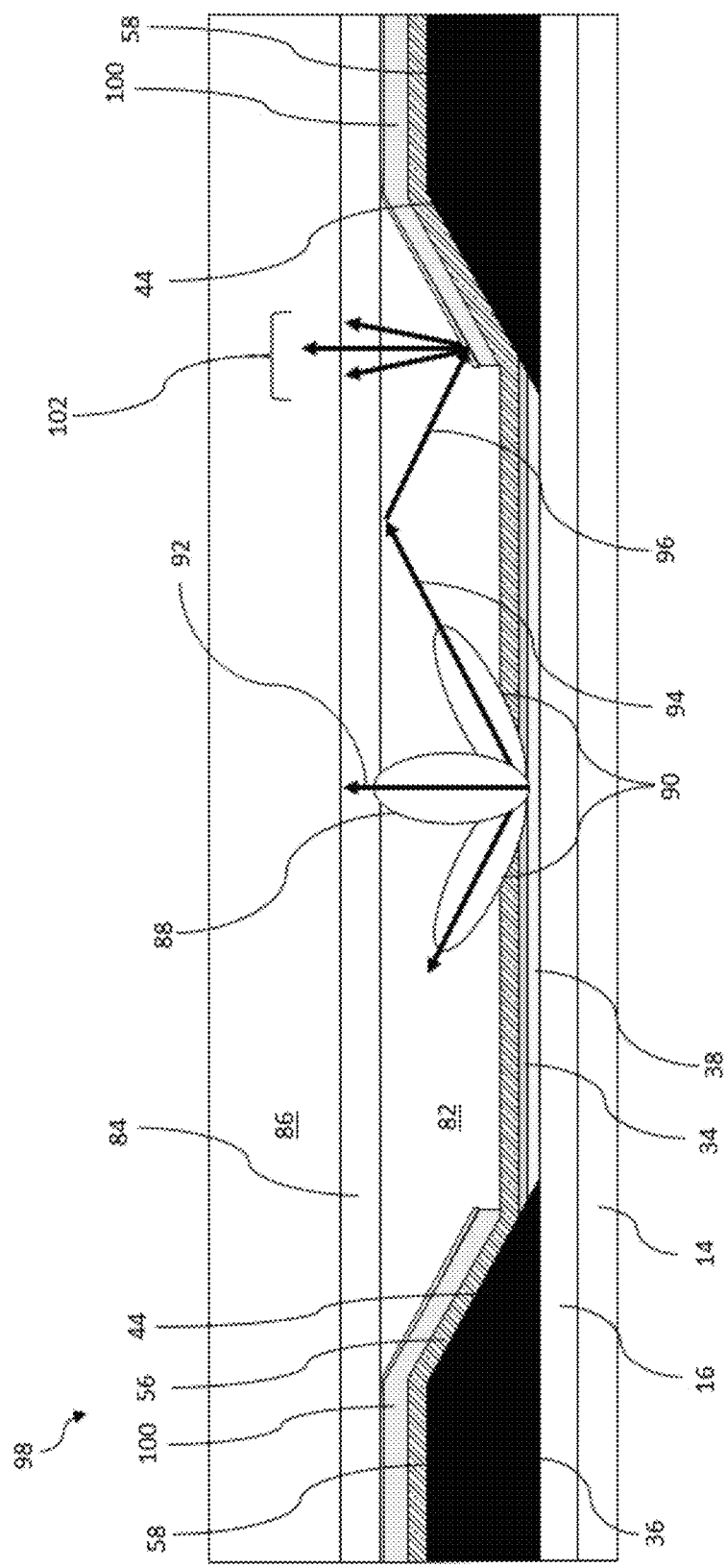
FIG. 12 illustrates an improved QLED sub-pixel further improved with a scattering surface to spread angles of reflection, in accordance with an example implementation of the present disclosure.

FIG. 12 illustrates an improved QLED sub-pixel further improved with a scattering surface to spread angles of reflection, in accordance with an example implementation of the present disclosure. In FIG. 12, a scattering QLED sub-pixel 98 is shown, designed to have a lower tolerance, to allow for pixel-to-pixel variation due to manufacturing error without compromising on efficiency uniformity. The QLED sub-pixel 98 includes a scattering auxiliary electrode 100 extending down the sloped surface 44 of each bank structure 36, acting as a reflective bank for a 3-D pixel. The surface of the scattering auxiliary electrode 100 is partially scattering so that incident light (i.e., TIR light 96) has a partial spread when reflected. The range of the spread of scattered reflected light 102 can be increased by increasing the scattering strength of the surface of the scattering auxiliary electrode 100.

To clarify the definition of a partially scattering surface, a perfect reflector is initially defined as a highly flat, metallic surface that reflects light at the same angle that it is incident (i.e., specular reflection). For a partially scattering surface, light rays are reflected at a random angle within a certain range. The stronger the scattering strength, the wider the angular range. The weaker the scattering strength, the narrower the angular range. The scattering strength is set so that the design tolerance is lowered to a suitable level for manufacturing precision.

The light rays in FIG. 12 show how incident light on the scattering surface of the auxiliary electrode get reflected with a spread of angles of reflection, in accordance with an example implementation of the present disclosure.

Figure 13:
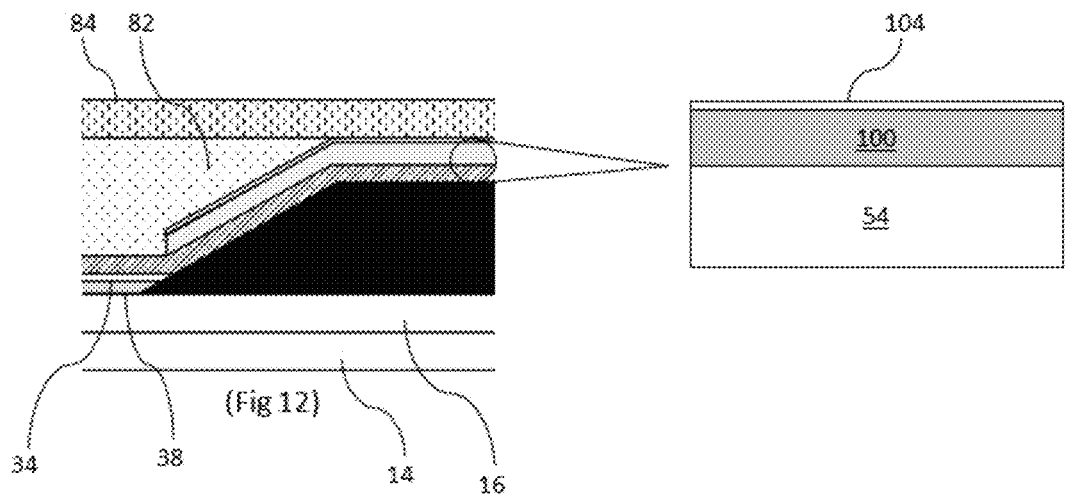
FIG. 13 illustrates an example of a scattering surface of an auxiliary electrode using a scattering layer, in accordance with an example implementation of the present disclosure.

In FIG. 13, a thin layer of material 104 is located on top of the scattering auxiliary electrode 100. The thin layer of material 104 induces a partial scatter in the light reflected from the scattering auxiliary electrode 100. By varying the thickness and/or density of the thin layer of material 104, the scattering strength of the scattering auxiliary electrode 100 can be controlled.

The thin layer of material 104 (i.e., the scattering layer) may be a random deposition of material creating a rough surface. Increasing the density of the deposition can increase the scattering strength. The thin layer of material 104 may be a metal oxide such as aluminum oxide, titanium oxide or germanium oxide. The metal oxide may be a monolayer or several monolayers. The thickness of the metal oxide thin layer of material 104 may be between 0.1 nm<t<10 nm.

Figure 14:
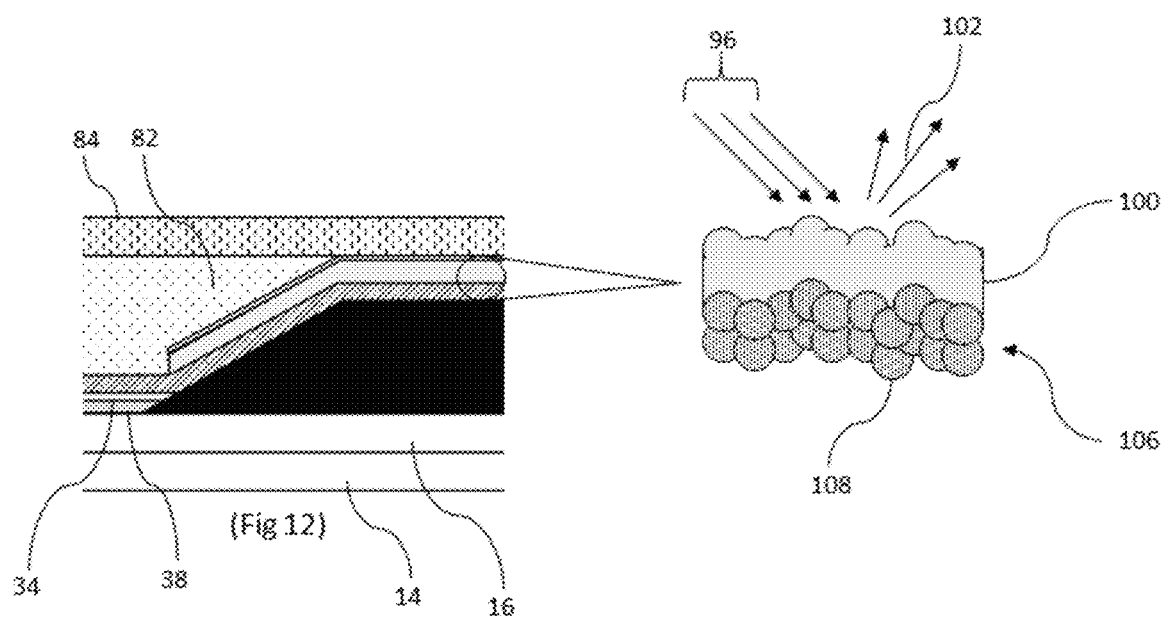
FIG. 14 illustrates a scattering surface of the auxiliary electrode created by using large transparent conductive nanoparticles, in accordance with an example implementation of the present disclosure.

FIG. 14 illustrates a scattering surface of the auxiliary electrode created by using large transparent conductive nanoparticles, in accordance with an example implementation of the present disclosure. In FIG. 14, the roughness of the scattering auxiliary electrode 100 surface can be controlled by the nature of an underlying large nanoparticle transparent conductive electrode 106. If small nanoparticles are used (e.g., $\varphi$<20 nm) then the surface of an auxiliary electrode may be optically smooth. Using larger nanoparticles results in a more optically rough auxiliary electrode. If the transparent conductive electrode 106 has a rough surface, the roughness will at least partly follow through to the surface of the scattering auxiliary electrode 100.

In one implementation, the large nanoparticle transparent conductive electrode 106 comprises transparent conductive nanoparticles 108 which when deposited give a surface roughness which induces a roughness on the surface of the auxiliary electrode 100 leading to a partial scatter. The surface roughness can be controlled be varying the transparent conductive nanoparticle 108 size (e.g., 20 nm<$\varphi$<100 nm). Larger transparent conductive nanoparticles 108 may impart a higher surface roughness. In a preferred implementation, the transparent conductive nanoparticles 108 have a size between 8 nm-100 nm.

Figure 15:
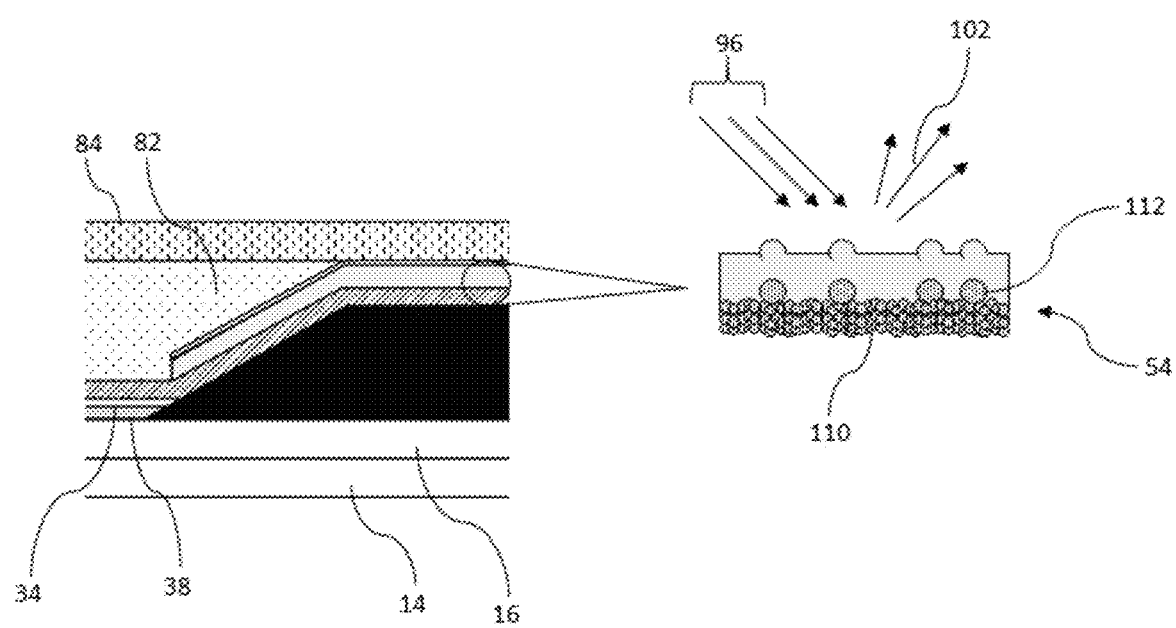
FIG. 15 illustrates a scattering surface of the auxiliary electrode created by using a discontinuous monolayer of transparent conductive nanoparticles, in accordance with an example implementation of the present disclosure.

FIG. 15 illustrates a scattering surface of the auxiliary electrode created by using a discontinuous monolayer of transparent conductive nanoparticles, in accordance with an example implementation of the present disclosure. In FIG. 15, a transparent conductive electrode (TCE) comprises two layers: a first TCE layer 110 optimized for conductivity and transmission, and a second TCE layer 112 deposited on top of the first TCE layer 110. The second TCE layer 112 is formed by depositing transparent conductive nanoparticles at a low concentration to form a discontinuous monolayer. Such a second TCE layer 112 yields a high roughness surface which can induce a scattering surface on the scattering auxiliary electrode 100 surface. As with the implementation shown in FIG. 14, the scattering strength can be controlled by varying the nanoparticle size but can also be controlled by controlling the density/concentration of the discontinuous monolayer.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A top emitting quantum dot light emitting diode (QLED) apparatus for an emissive display apparatus including a sub-pixel, with at least one bank defining an emissive region of the sub-pixel, the top emitting QLED apparatus comprising:
   an emissive layer deposited in the emissive region between a first electrode and a second electrode, wherein:
   the first electrode comprises a reflective metal;
   the second electrode comprises a transparent conductive electrode and an auxiliary electrode;
   the at least one bank comprises a sloped portion adjacent the emissive region;
   the auxiliary electrode comprises a reflective conductive metal and is configured to cover the sloped portion;
   the sloped portion is configured at an angle, such that the auxiliary electrode reflects internally reflected light out of the sub-pixel in a viewing direction;
   the auxiliary electrode is further configured with a partially light scattering surface to broaden a reflective angle range of the auxiliary electrode; and
   the transparent conductive electrode comprises nanoparticles measuring between 20 nm and 100 nm thereby imparting an optically rough surface to the auxiliary electrode for scattering light.

2. The top emitting QLED apparatus of claim 1, wherein the partially light scattering surface comprises a thin film scattering layer deposited over the auxiliary electrode, the thin film scattering layer being between 0.1 nm and 10 nm in thickness.

3. The top emitting QLED apparatus of claim 1, further comprising a discontinuous monolayer of the nanoparticles deposited on the transparent conductive electrode, thereby imparting the optically rough surface to the auxiliary electrode for scattering light.

4. The top emitting QLED apparatus of claim 1, wherein a first area of the transparent conductive electrode covering the sloped portion is thinner than a second area of the transparent conductive electrode covering the emissive region.

5. The top emitting QLED apparatus of claim 1, wherein a first area of the transparent conductive electrode covering the sloped portion is more porous than a second area of the transparent conductive electrode covering the emissive region.

6. The top emitting QLED apparatus of claim 1, further comprising a transparent filler material configured to fill an interior space above the sub-pixel and surrounded by the sloped portion of the at least one bank.

7. The top emitting QLED apparatus of claim 6, wherein the transparent filler material has a refractive index between 1.5 and 2.0.

8. The top emitting QLED apparatus of claim 6, further comprising a transparent low refractive index layer covering the transparent filler material, the transparent low refractive index layer having a refractive index between 1.0 and 1.5.

9. The top emitting QLED apparatus of claim 1, wherein the at least one bank further comprises a top portion adjacent to the sloped portion, and the auxiliary electrode covers the sloped portion and the top portion.

10. A top emitting quantum dot light emitting diode (QLED) apparatus for an emissive display apparatus having a plurality of sub-pixels separated by a bank structure, and each sub-pixel of the plurality of sub-pixels having an emissive region, the top emitting QLED apparatus comprising:
a plurality of emissive layers, each disposed in the emissive region between a plurality of first electrodes and a second electrode, wherein:
each of the plurality of first electrodes comprises a reflective metal that is individually separated by the bank structure;
the second electrode comprises a transparent conductive electrode and an auxiliary electrode;
the bank structure comprises a plurality of sloped portions each surrounding a corresponding emissive region;
the auxiliary electrode comprises a reflective conductive metal configured to cover the plurality of sloped portions;
each of the plurality of sloped portions is configured at an angle, such that the auxiliary electrode reflects internally reflected light out of each of the plurality of sub-pixels in a viewing direction;
the auxiliary electrode further comprises a partially light scattering surface configured to broaden a reflective angle range of the auxiliary electrode; and
the transparent conductive electrode comprises nanoparticles measuring between 20 nm and 100 nm on the plurality of sloped portions, thereby imparting an optically rough surface to the auxiliary electrode for scattering light.

11. The top emitting QLED apparatus of claim 10, wherein the partially light scattering surface comprises a thin film scattering layer deposited over the auxiliary electrode, the thin film scattering layer being between 0.1 nm and 10 nm in thickness.

12. The top emitting QLED apparatus of claim 10, further comprising an interrupted monolayer of the nanoparticles deposited on the transparent conductive electrode, thereby imparting the optically rough surface to the auxiliary electrode for scattering light.

13. The top emitting QLED apparatus of claim 10, wherein a first area of the transparent conductive electrode covering the plurality of sloped portions is thinner than a second area of the transparent conductive electrode covering the corresponding emissive region.

14. The top emitting QLED apparatus of claim 10, further comprising a transparent filler material configured to fill an interior space above the plurality of sub-pixels and surrounded by at least one of the plurality of sloped portions.

15. The top emitting QLED apparatus of claim 14, wherein the transparent filler material has a refractive index between 1.5 and 2.0.

16. The top emitting QLED apparatus of claim 15, further comprising a transparent low refractive index layer over the transparent filler material, the transparent low refractive index layer having a refractive index between 1.0 and 1.5.

17. The top emitting QLED apparatus of claim 10, wherein the bank structure further comprises at least one top portion adjacent the plurality of sloped portions, and the auxiliary electrode covers the plurality of sloped portions and the at least one top portion.

18. A top emitting quantum dot light emitting diode (QLED) apparatus for an emissive display apparatus including a sub-pixel, with at least one bank defining an emissive region of the sub-pixel, the top emitting QLED apparatus comprising:
an emissive layer deposited in the emissive region between a first electrode and a second electrode, wherein:
the first electrode comprises a reflective metal;
the second electrode comprises a transparent conductive electrode and an auxiliary electrode;
the at least one bank comprises a sloped portion adjacent the emissive region;
the auxiliary electrode comprises a reflective conductive metal and is configured to cover the sloped portion;
the sloped portion is configured at an angle, such that the auxiliary electrode reflects internally reflected light out of the sub-pixel in a viewing direction; and
the auxiliary electrode is further configured with a partially light scattering surface to broaden a reflective angle range of the auxiliary electrode,
the top emitting QLED apparatus further comprising:
a discontinuous monolayer of nanoparticles deposited on the transparent conductive electrode, thereby imparting an optically rough surface to the auxiliary electrode for scattering light.

19. The top emitting QLED apparatus of claim 18, wherein the partially light scattering surface comprises a thin film scattering layer deposited over the auxiliary electrode, the thin film scattering layer being between 0.1 nm and 10 nm in thickness.

* * * * *